US009173286B2

(12) United States Patent
Sporon-Fiedler et al.

(10) Patent No.: US 9,173,286 B2
(45) Date of Patent: Oct. 27, 2015

(54) FLEXIBLE-RIGID CIRCUIT BOARD COMPOSITE AND METHOD FOR PRODUCING A FLEXIBLE-RIGID CIRCUIT BOARD COMPOSITE

(71) Applicant: BIOTRONIK SE & Co. KG, Berlin (DE)

(72) Inventors: Frederik Sporon-Fiedler, Corvallis, OR (US); Jana Carraway, Tigard, OR (US); Michael Henderson, Canby, OR (US)

(73) Assignee: BIOTRONIK SE & Co. KG, Berlin (DE)

( * ) Notice: Subject to any disclaimer, the term of this patent is extended or adjusted under 35 U.S.C. 154(b) by 76 days.

(21) Appl. No.: 13/910,523

(22) Filed: Jun. 5, 2013

(65) Prior Publication Data
US 2013/0333925 A1  Dec. 19, 2013

Related U.S. Application Data

(60) Provisional application No. 61/659,988, filed on Jun. 15, 2012.

(51) Int. Cl.
H05K 1/00 (2006.01)
H05K 1/02 (2006.01)
H05K 3/36 (2006.01)
H05K 3/46 (2006.01)

(52) U.S. Cl.
CPC .............. H05K 1/0278 (2013.01); H05K 3/361 (2013.01); H05K 3/363 (2013.01); H05K 3/368 (2013.01); H05K 3/4638 (2013.01); H05K 2203/166 (2013.01); Y10T 29/49126 (2015.01)

(58) Field of Classification Search
CPC . H05K 1/0393; H05K 3/4691; H05K 3/0052; H05K 2201/058; H05K 2201/0909; H05K 2203/0152; H05K 3/007; H05K 2203/166

USPC ............ 174/254, 255; 361/749, 813; 257/797
See application file for complete search history.

(56) References Cited

U.S. PATENT DOCUMENTS 7,690,104 B2     4/2010  Rosenblatt et al.
8,234,780 B2 *   8/2012  Harvilchuck et al. .......... 29/832
(Continued)

FOREIGN PATENT DOCUMENTS

EP     0065425     11/1982
WO   2007116344    10/2007
WO   2010086416     8/2010

OTHER PUBLICATIONS

European Search Report and Annex to the European Search Report on European Patent Application No. EP 13 16 7449, dated Oct. 21, 2013 (7 pages).

Primary Examiner — Hung S Bui
Assistant Examiner — James Wu
(74) Attorney, Agent, or Firm — Buchanan Ingersoll & Rooney PC

(57) ABSTRACT

A flexible circuit board for producing a flexible-rigid circuit board composite made of at least one flexible circuit board and at least one rigid circuit board, the at least one flexible circuit board having at least one first planar segment, which interacts as intended in the installed state with at least one second planar segment of the at least one rigid circuit board, wherein the at least one first planar segment comprises at least one flexible connecting element, which is elastically connected to a face of the at least one first planar segment. Furthermore, a flexible-rigid circuit board composite is provided having at least one flexible circuit board, a flexible-rigid circuit board arrangement, and a method and a device for producing a flexible-rigid circuit board composite.

11 Claims, 6 Drawing Sheets

(56) References Cited

U.S. PATENT DOCUMENTS

| | | |
|---|---|---|
| 2004/0118595 A1 | 6/2004 | Flammer et al. |
| 2008/0045077 A1 | 2/2008 | Chou |
| 2009/0205200 A1 | 8/2009 | Rosenblatt et al. |
| 2009/0288871 A1 | 11/2009 | Lin |

* cited by examiner

FLEXIBLE-RIGID CIRCUIT BOARD COMPOSITE AND METHOD FOR PRODUCING A FLEXIBLE-RIGID CIRCUIT BOARD COMPOSITE

CROSS-REFERENCE TO RELATED APPLICATIONS

This patent application claims the benefit of U.S. Provisional Patent Application No. 61/659,988, filed on Jun. 15, 2012, which is hereby incorporated by reference in its entirety.

TECHNICAL FIELD

The present invention relates to a flexible-rigid circuit board composite and a method for producing a flexible-rigid circuit board composite according to the preambles of the independent claim(s).

BACKGROUND

A flexible-rigid circuit board composite represents a hybrid composite of circuit boards, also referred to as PCB (printed circuit board), in which flexible and rigid circuit boards are connected to one another to form a single circuit board composite. The various layers of a multilayer flexible-rigid circuit board composite are typically connected via metallically coated through openings.

U.S. Publication No. 2004/0118595 discloses a circuit board composite made of flexible and rigid circuit boards, in which at least one flexible circuit board is arranged on at least one rigid circuit board. For this purpose, the rigid circuit board intentionally has a structural weak point at a defined position. The structural weak point is used for the purpose of intentionally breaking off the rigid circuit board and connecting the fracture edges to the flexible circuit board.

A method for producing a rigid-flexible printed circuit board composite (PCB) from rigid and flexible circuit boards is disclosed in U.S. Pat. No. 7,690,104. The circuit boards are placed on a carrier, on which the circuit boards are aligned to one another so that the bond regions of the flexible circuit board overlap with the bond regions of the rigid circuit board. The aligned circuit boards are subsequently pressed together and sent through a reflow furnace, with the solder on the circuit boards melting and, after the solidification, the circuit boards and electrical components located thereon being mechanically and electrically connected.

The fastening of flexible connecting bridges to rigid or stiffened PCBs is typically performed to utilize the advantages of packaging, i.e., construction and connection technology, with flexible substrates in costly electronic components, in which significantly more cost-effective rigid circuit boards are used for reasons of cost. Such a connection step, typically by means of hot bar soldering or laser soldering, is performed in discrete steps, circuit by circuit.

The additional handling and positioning of isolated flexible connecting bridges and PCB structures is difficult to automate, which results in high production costs and decreases the cycle time for the production of the flexible connections. In small PCB structures, as are used in medical implants, these problems are increased still further.

The present invention is directed toward overcoming one or more of the above-identified problems.

The present invention is based on an object of providing a flexible circuit board which allows extensive automation of the production method of a flexible-rigid circuit board composite.

A further object is the provision of a flexible circuit board arrangement having at least one flexible circuit board for a flexible-rigid circuit board composite, which allows extensive automation of the production method of a flexible-rigid circuit board composite.

Yet a further object is to provide a flexible-rigid circuit board composite which is producible cost-effectively with high precision and is suitable, in particular, for electronics in medical implants.

Still a further object comprises providing an improved method for producing a flexible-rigid circuit board composite.

SUMMARY

An object(s) is achieved according to the present invention by the features of the independent claim(s). Advantageous exemplary embodiments and advantages of the present invention result from the further claims, the drawings, and the description.

According to a first aspect, the present invention is directed to a flexible circuit board for producing a flexible-rigid circuit board composite made of at least one flexible circuit board and at least one rigid circuit board, the at least one flexible circuit board having at least one first planar segment, which interacts as intended with at least one second planar segment of the at least one rigid circuit board in the installed state.

It is proposed that the at least one planar segment comprise at least one flexible connecting element, which is elastically connected to a face of the at least one first planar segment.

Through the elastic connection, the flexible connecting element can be movable, in particular, parallel to the surface of the first planar segment, in particular within the first planar segment. If the first planar segment extends, e.g., in the x-y plane, the flexible connecting element can advantageously be movable in the x-direction and in the y-direction before a fixed connection to the rigid circuit board. It is advantageously possible through the elastic connection of the flexible connecting element to align it for contacting with high precision. The flexible connecting element can be coarsely pre-aligned for this purpose, if the flexible circuit board having the at least one first planar segment is moved toward its connection partner, the rigid circuit board, during installation as intended. This can be performed particularly advantageously if multiple first and second planar segments are provided in a matrix-type arrangement, which can be aligned in parallel in one method step.

The flexible connecting element can have one or more electrical components, for example, electrical feedthroughs, components such as surface-mountable SMD components (SMD=surface-mounted device), electrical circuits, and the like.

According to an advantageous embodiment, the at least one flexible connecting element can be embedded within the face of the at least one first planar segment. This allows simple production of the flexible connecting element using typical means in the production of circuit boards.

According to an advantageous embodiment, the at least one flexible connecting element can be connected by means of elastic webs to the face of the at least one first planar segment. Such elastic webs can be structured by suitable shaping, for example, serpentine fingers, protrusions arranged transversely to the longitudinal extension, and the like, during the production of the circuit board, for example, by means of etching technology, laser cutting, and the like.

According to an advantageous embodiment, at least one opening can be provided in the at least one first planar segment, through which, in the intended installed state of the at least one flexible and rigid circuit boards, one or more components of the at least one rigid circuit board can be accessible. Therefore, components on the rigid circuit board cannot collide with the flexible circuit board when the flexible circuit board and rigid circuit board are brought into contact. The placement of the components on the rigid circuit board can be performed uninfluenced by the flexible connecting element installed later.

According to an advantageous embodiment, the flexible connecting element can directly adjoin the opening and the flexible connecting element can have an indentation, which is provided in the intended installed state as a contacting zone between the flexible circuit board and the rigid circuit board. The space occupied by the arrangement is thus reduced. The connection zone between flexible and rigid circuit boards can be precisely defined.

According to a further aspect, the present invention is directed to a circuit board arrangement having at least one flexible circuit board according to the present invention, the at least one flexible circuit board being clamped in a frame. This makes the handling of the flexible circuit board arrangement easier.

According to an advantageous embodiment, a plurality of first planar segments can be provided in a matrix-type arrangement, which first planar segments each comprise at least one flexible connecting element, which are each elastically connected to a face of the at least one first planar segment.

This embodiment allows a plurality of first planar segments of a flexible circuit board arrangement to be processed jointly, which reduces the throughput during the production of a flexible-rigid circuit board composite. The first planar segments of the flexible circuit board arrangement advantageously correspond to second planar segments of the rigid circuit board arrangement.

Through the elastic attachment of the respective flexible connecting element to the face of its planar segment, after a coarse pre-alignment of the flexible circuit board arrangement in relation to its connection partner, in particular, a rigid circuit board arrangement, a fine alignment of the respective flexible connecting elements to second planar segments of the rigid circuit board arrangement can be performed by machine. In particular, this can be performed by means of an optical alignment method on an x-y stage, on which the flexible and rigid circuit board arrangements laid one over another are laid, and in which a corresponding alignment movement of the flexible connecting element for fine alignment can be performed. For example, a vacuum suction unit can be applied to the flexible connecting element, which moves the flexible connecting element with optical monitoring to its end position in relation to the assigned second planar segment of the rigid circuit board arrangement.

According to a further aspect, the present invention is directed to a flexible-rigid circuit board composite made of at least one flexible circuit board according to the present invention and at least one rigid circuit board, the at least one flexible circuit board having at least one first planar segment, which interacts as intended with at least one second planar segment of the at least one rigid circuit board.

It is proposed that the at least one first planar segment comprises at least one flexible connecting element, which is elastically connected to a face of the at least one first planar segment.

The elastic connection or attachment of the flexible planar segment can advantageously be performed through corresponding shaping of connecting webs between the flexible planar segment and the face during the production of the flexible circuit board or circuit board arrangement.

In particular, the at least one flexible connecting element can be embedded within the face of the at least one first planar segment. Therefore, less complex manufacturing and handling of the flexible circuit board or circuit board arrangement is possible.

According to an advantageous embodiment, at least one opening can be provided in the at least one first planar segment, through which one or more components of the at least one rigid circuit board can be accessible. This allows placement of the components on the rigid circuit board or circuit board arrangement to be uninfluenced by later installation of the flexible circuit board or circuit board arrangement.

According to an advantageous embodiment, a contacting zone, in particular, a soldering zone, can be provided, the contacting zone being able to be arranged on an interface between the at least one flexible connecting element and the at least one opening. In this way, a precisely defined position of the contacting zone is available, which, in particular, in the case of an array of first planar segments allows automated fine alignment and automated production of soldered connections.

According to an advantageous embodiment, the at least one flexible circuit board and the at least one rigid circuit board can be formed by isolating planar segments, respectively, of a flexible and rigid circuit board arrangement. A plurality of in particular similar circuit board composites can thus be manufactured by machine.

According to a further aspect, the present invention relates to a method for producing a circuit board composite between a flexible circuit board according to the present invention and a rigid circuit board, the method being characterized by the following steps:

providing a flexible circuit board arrangement and a rigid circuit board arrangement, the flexible circuit board arrangement having at least one planar segment which has a flexible connecting element which is elastically connected to a face of the at least one first planar segment;

bringing the flexible and rigid circuit board arrangements into contact with one another with a pre-alignment of the at least one first planar segment of the flexible circuit board arrangement in relation to at least one second planar segment of the rigid circuit board arrangement;

finely aligning the at least one first planar segment in relation to the at least one second planar segment by adapting a position of the flexible connecting element at least parallel to or within the at least one first planar segment;

connecting the at least one first planar segment to the at least one second planar segment;

forming at least one circuit board composite by cutting out the connected first and second planar segments from the connected circuit board arrangements.

A method for connecting flexible connecting elements to rigid circuit boards can advantageously be provided, which can be carried out by machine. The method allows high throughput and precise alignment of flexible connecting elements in relation to rigid circuit boards.

The method can advantageously be carried out using typical facilities. The production of flexible-rigid circuit board composites can be performed more rapidly and cost-effectively. In particular, flexible-rigid circuit board composites having small dimensions, as are required in medical implants, can be provided.

According to an advantageous embodiment, the at least one second planar segment can have one or more components, in particular SMD components, which are prepared on their contact regions for a soldered connection, the connection of the first and second planar segments being able to be performed in a processing step with connection of the one or more SMD components to contact faces of the at least one second planar segment.

The arrangement made of flexible and rigid circuit board arrangements can be arranged fixed in place, i.e., a device for aligning and soldering moving in relation to the arrangement, or the arrangement made of flexible and rigid circuit board arrangements can be arranged so it is movable in relation to a fixed device for aligning and soldering, for example, on an x-y stage, which is movable in the x-direction and in the y-direction.

According to an advantageous embodiment, the at least one first planar segment, before the flexible and rigid circuit board arrangements are brought into contact with one another, can be pre-equipped with one or more components, in particular SMD components, for example, capacitors, feedthroughs, circuits, and the like. The method according to the present invention and the embodiment according to the present invention of the flexible circuit board arrangement allow great design freedom.

According to a further aspect, the present invention also relates to a device for carrying out the method according to the present invention for producing a circuit board composite between a flexible circuit board and a rigid circuit board, having at least one flexible circuit board, with at least the following steps being able to be performed:

finely aligning the at least one first planar segment in relation to the at least one second planar segment by adapting a position of the flexible connecting element at least parallel to or within the at least one first planar segment; and connecting the at least one first planar segment to the at least one second planar segment.

The device advantageously allows automated handling in parallel of multiple flexible connecting element simultaneously, which are connected to rigid circuit boards in an automated manner. The production costs are reduced in comparison to production costs in the case of single part handling. The general piece costs of a production method of hybrid structures having cost-effective rigid circuit boards and flexible connecting elements of flexible circuit boards are reduced. Through the automation of the method, error rates can be reduced and the product output can be increased.

It is advantageously possible to make so-called tape automated bonding (TAB), a contacting method for semiconductor chips, which allows rapid automated installation directly on the circuit board, usable in such a circuit board composite.

Further features, aspects, objects, advantages, and possible applications of the present invention will become apparent from a study of the exemplary embodiments and examples described below, in combination with the figures, and the appended claims.

DESCRIPTION OF THE DRAWINGS

The present invention is explained in greater detail hereafter for exemplary purposes on the basis of exemplary embodiments shown in drawings. In the schematic figures.

DETAILED DESCRIPTION

Figure 1:
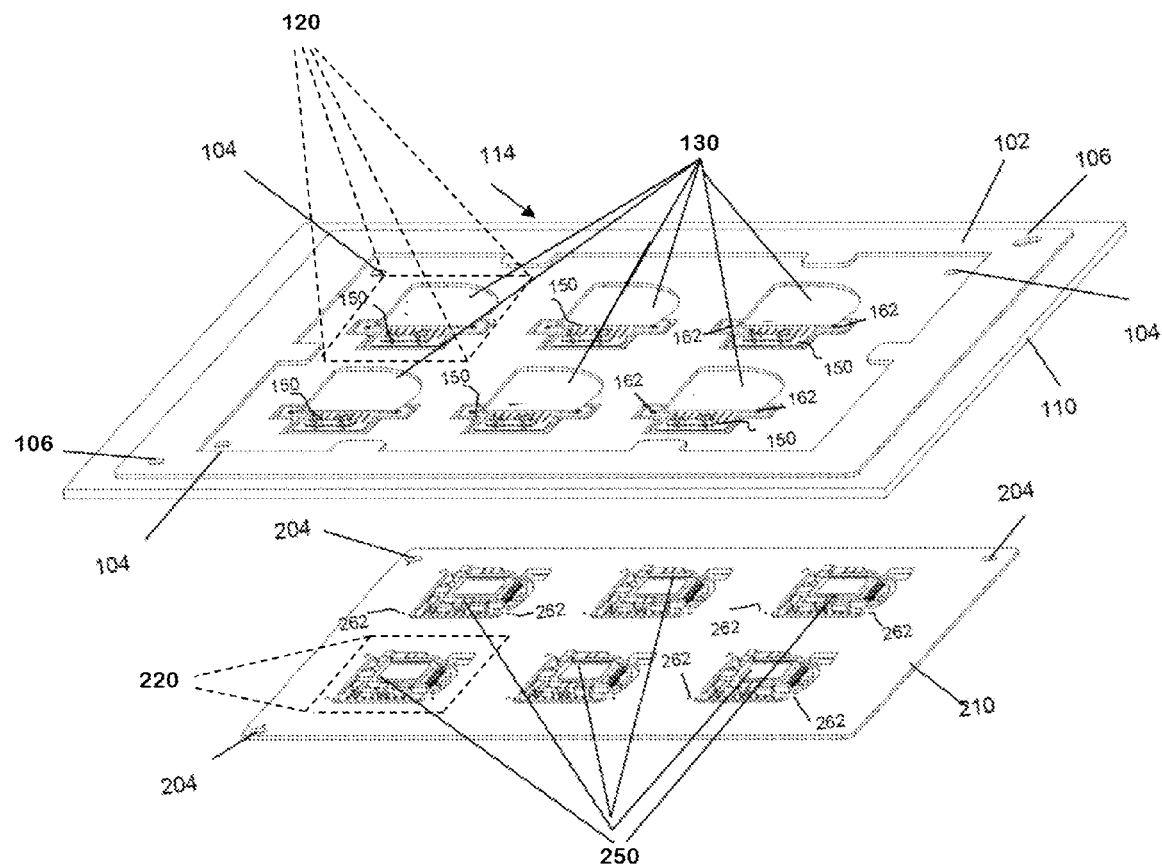
FIG. 1 shows an exploded view of an exemplary embodiment of a rigid circuit board arrangement having an array of preinstalled components and a flexible circuit board arrangement having an array of flexible connecting elements according to the present invention.

In the figures, functionally identical or identically acting elements are each identified by the same reference numerals. The figures are schematic illustrations of the present invention. They illustrate non-specific parameters of the present invention. Furthermore, the figures merely illustrate typical embodiments of the present invention and are not to restrict the present invention to the embodiments shown.

Figure 2:
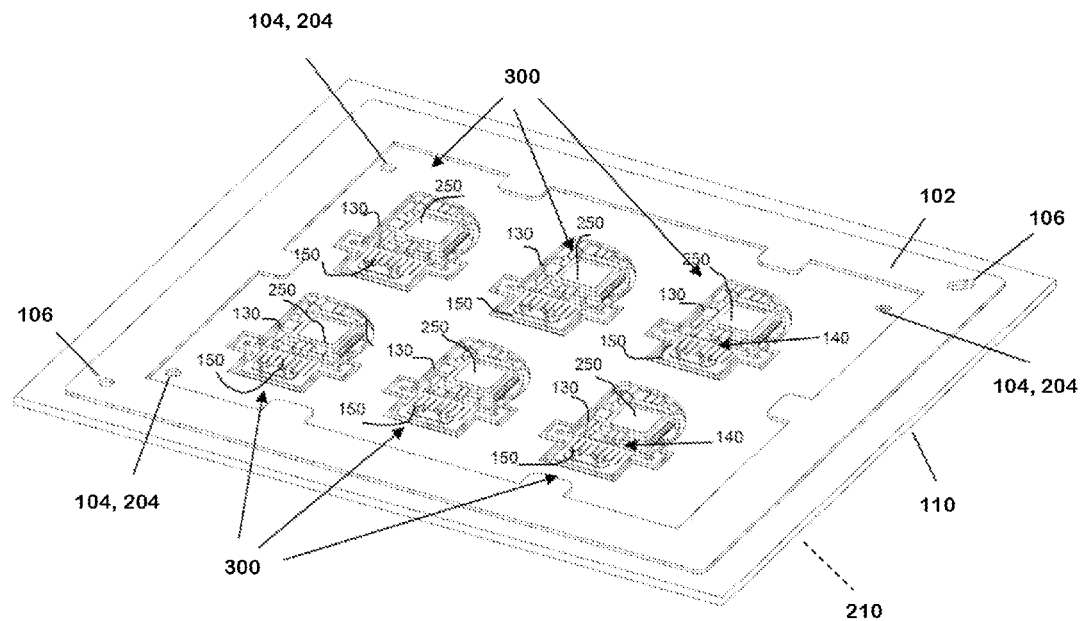
FIG. 2 shows, in the assembled state, the rigid circuit board arrangement and the flexible circuit board arrangement from FIG. 1.

To explain the present invention, FIG. 1 shows an exploded view of an exemplary embodiment of a flexible circuit board arrangement 110 having a matrix-type arrangement (array) of first planar segments 120, of which each planar segment 120 has a flexible connecting element 150, and a rigid circuit board arrangement 210 having a corresponding array of second planar segments 220, each of which comprises preinstalled components 250. FIG. 2 shows, in the assembled state, the flexible circuit board arrangement 110 and the rigid circuit board arrangement 210 from FIG. 1. The flexible circuit board arrangement 110 is formed, for example, from a plastic, e.g., polyimide and the like.

Figure 3:
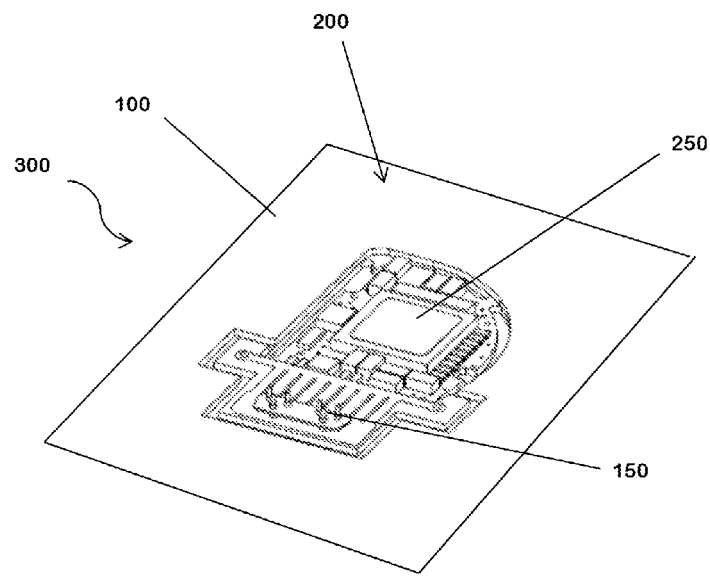
FIG. 3 shows an isolated flexible-rigid circuit board composite according to the exemplary embodiment of FIG. 1.

First and second planar segments 120, 220, which are connected to one another, form in each case a flexible-rigid circuit board composite 300, which is obtained by cutting off (isolation) from the connected circuit board arrangements 110, 210. FIG. 3 shows a flexible-rigid circuit board composite 300 according to the exemplary embodiment of FIG. 1, which is formed by isolating the planar segments 120, 220.

For example, the rigid circuit board arrangement 210 comprises an array of six second planar segments 220, each having a number of components 250, in particular, surface-mounted components (SMD components), while the flexible circuit board arrangement 110 comprises an array of six first planar segments 120 each having a flexible connecting element 150. One skilled in the art will appreciate that the numbers of planar segments may vary, and the present invention is not limited to six on each circuit board arrangement.

The flexible circuit board arrangement 110 is integrated for better handling in a unit 114 and clamped in a frame 102 of the unit 114. Markings 104 in the flexible circuit board arrangement 110, e.g., in the form of openings, correspond to markings 204 of the rigid circuit board arrangement 210. These are used for the coarse alignment of the two circuit board arrangements 110, 210 to one another. The alignment can be performed using optical image recognition, for example.

Markings 162 on the respective flexible connecting elements 150 (only identified on two first planar segments 120 in the figures) correspond to markings 262 of the second planar segments 220. These markings 162, 262 are used for the fine alignment of the flexible connecting elements 150 in relation to the planar segments 220. The alignment can be performed using optical image recognition, for example.

Markings 106 on the unit 114 can be used for the initial coarse alignment of the unit 114 in relation to the second circuit board arrangement 210.

Each first planar segment 120 of the flexible circuit board arrangement 110 has, adjacent to the respective flexible connecting element 150, an opening 130, through which the components 250 of the rigid circuit board arrangement 210 are accessible. The components 250 on the rigid circuit board arrangement 210, which are preinstalled on the planar segments 220, can protrude through the opening 130, without being disturbed by the flexible circuit board arrangement 110, or its contact arrangements. In particular, the flexible circuit board arrangement 110 is implemented so that the components 250 on the rigid circuit board arrangement 210 do not interfere with the arrangement of the contact arrangement of the flexible circuit board arrangement 110, via which it is connected to the rigid circuit board arrangement 210. The flexible connecting element 150 is elastically connected to a face of the planar segment 120, which allows a fine alignment of the flexible connecting element 150 during the connection step, in that the flexible connecting element 150 is aligned in narrow boundaries in the plane of the first planar segment 120.

The arrangement in FIG. 2 shows the combination of the flexible circuit board arrangement 110 with the rigid circuit board arrangement 210, prealigned and ready for laying on an x-y stage, and a device for carrying out the fine alignment of the respective flexible connecting elements 150 and for producing the soldered connection.

In order to execute the connection, the rigid circuit board arrangement 210, which is prepared for the soldered connection by being previously tin plated and provided with flux on the contact faces, is brought into contact with the flexible circuit board arrangement 110 and laid on the x-y stage of the device (not shown). The device is programmed to position the combination under a unit for the alignment and soldered connection. The unit can comprise an image recognition mechanism, for example, so that the alignment can be performed automatically by image recognition. This unit has a vacuum gripper on a fine alignment head, using which the elastically attached flexible connecting element 150 can be moved within narrow boundaries, in order to align it precisely to the corresponding region of the rigid circuit board arrangement with assistance of the image recognition system. If the flexible connecting element 150 is precisely aligned, the connecting is performed by means of a hot bar soldering tool or a laser soldering tool, for example.

Of course, it is also conceivable to mount the combination of the flexible and rigid circuit board arrangements 110, 210 in a stationary manner and to move the unit for alignment and soldered connection in relation thereto using a corresponding x-y stage or a robot arm, on the other hand.

If the soldered connection between the flexible and rigid circuit board arrangements 110, 210 has been executed, isolation of the array can be performed, for example, by means of laser cutting or mechanical methods.

FIGS. 4-7 show detail views of exemplary embodiments of a first planar segment 120 having a flexible connecting element 150, which is elastically connected to a face 122 of the first planar segment 120. The planar segment 120 is part of the flexible circuit board 100, in particular.

The flexible connecting element 150 has a face 152, which is essentially aligned with the face 122 and is elastically attached to this face 122. Components can be arranged in an inner region 154. For example, a feedthrough 160 having contact pins arranged perpendicularly (to the plane of the drawing) is shown. Furthermore, two markings 162 are provided in the inner region 154, which correspond to markings 262 (see FIG. 1) of the corresponding second planar segment 220 (see FIG. 1) of the rigid circuit board arrangement 210 (see FIG. 1) and which allow a fine alignment.

The flexible connecting element 150 has, in this exemplary embodiment, a T-shaped footprint having a crossbeam 156 and a web 158 arranged transversely thereto, with the feedthrough 160 being arranged on the end opposite to the crossbeam 156. The crossbeam 156 has a recess on its free end, which forms a contact zone 140, on which the connection between the flexible connecting element 150 and the second planar segment 220 is produced. The connection between the flexible circuit board arrangement 110 and the rigid circuit board arrangement 210 or the flexible circuit board 100 and the rigid circuit board 200 is thus also produced (see FIG. 3).

The contact zone 140 is arranged on an interface 142 between the flexible connecting element 150 and an opening 130, through which in case of contact the components 250 (see FIGS. 2-3) of the rigid circuit board arrangement 210/ circuit board 200 can protrude. The contour 132 of the opening is adapted to the corresponding dimensions of the second planar segment 210 (see FIGS. 2-3).

A trench 170 is arranged between the face 122 of the first planar segment 120 and the face 152 of the flexible connecting element 150, which separates the two faces 152, 122 from one another and permits a movement of the flexible connecting element 150 relative to the face 122.

A plurality of connecting webs 172 extends between the edges of the trench 170, whose shaping allows them to be elastic and allows a lateral movement of the connecting element 150 within the plane or parallel to the surface of the first planar segment 120.

Figure 4:
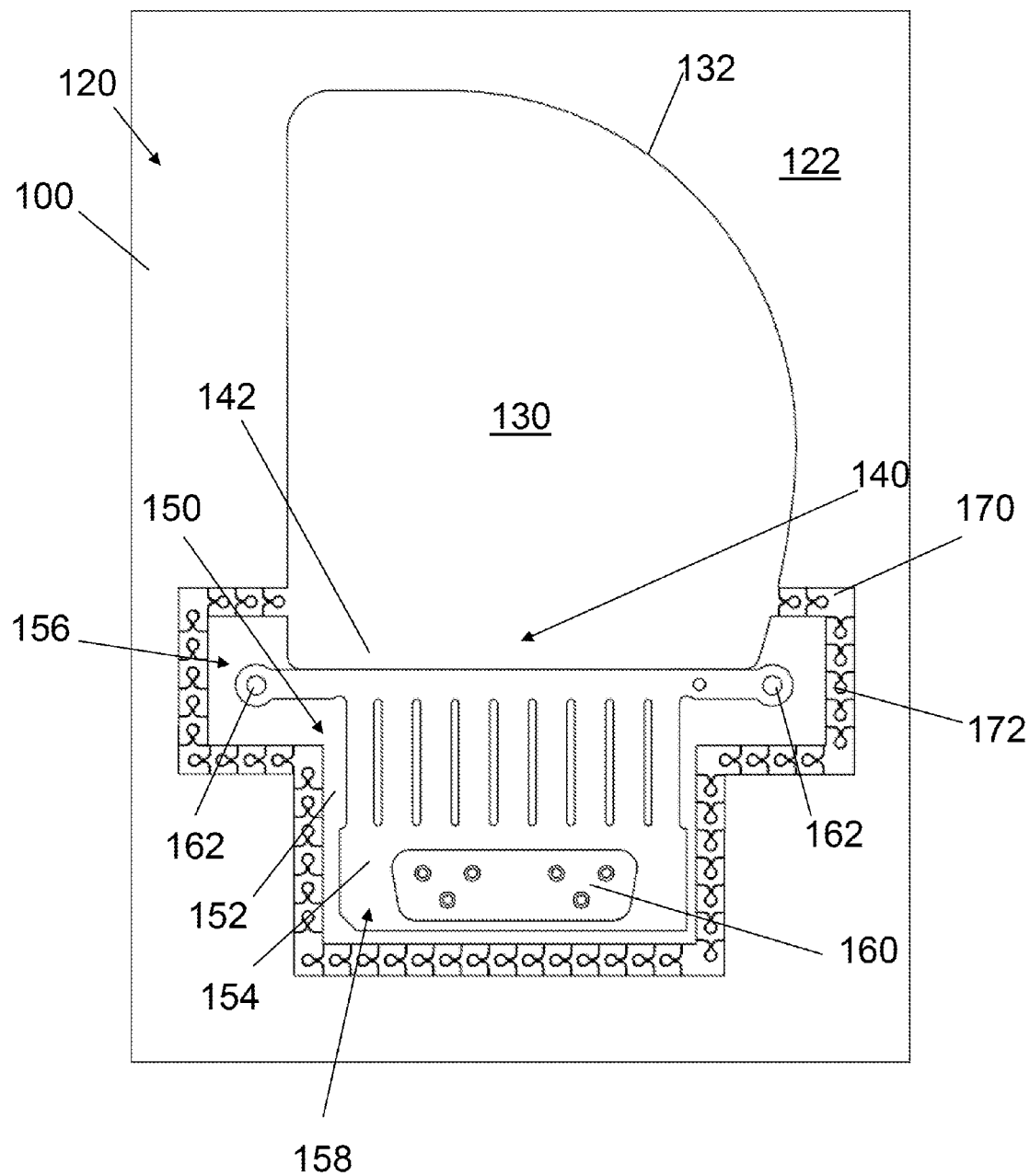
FIG. 4 shows a detail view of an embodiment of a first planar segment having a flexible connecting element, which is elastically connected using serpentine webs to a face of the first planar segment.
Figure 5:
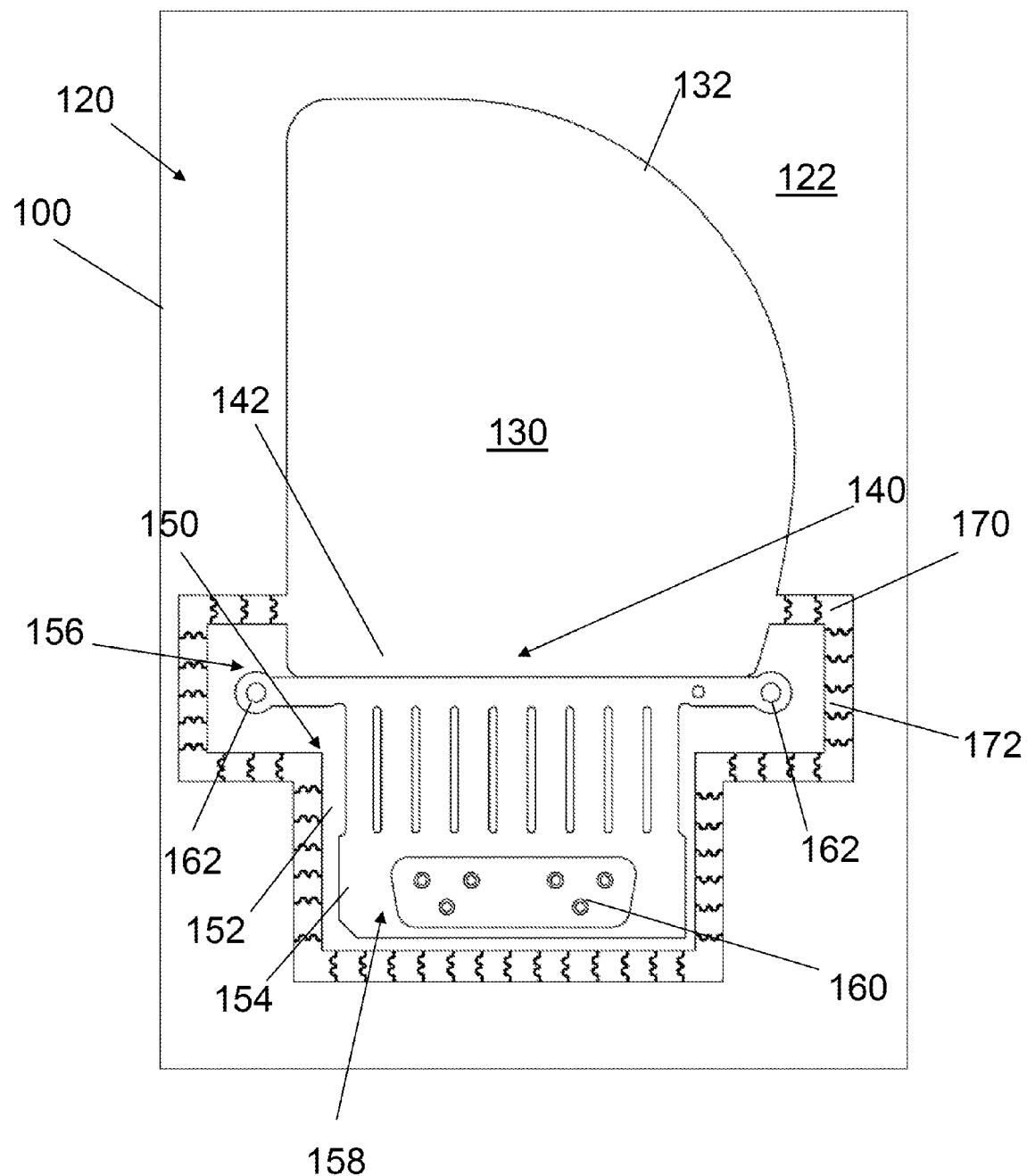
FIG. 5 shows a detail view of a further exemplary embodiment of a first planar segment having a flexible connecting element, which is elastically connected using wavy webs to a face of the first planar segment.
Figure 6:
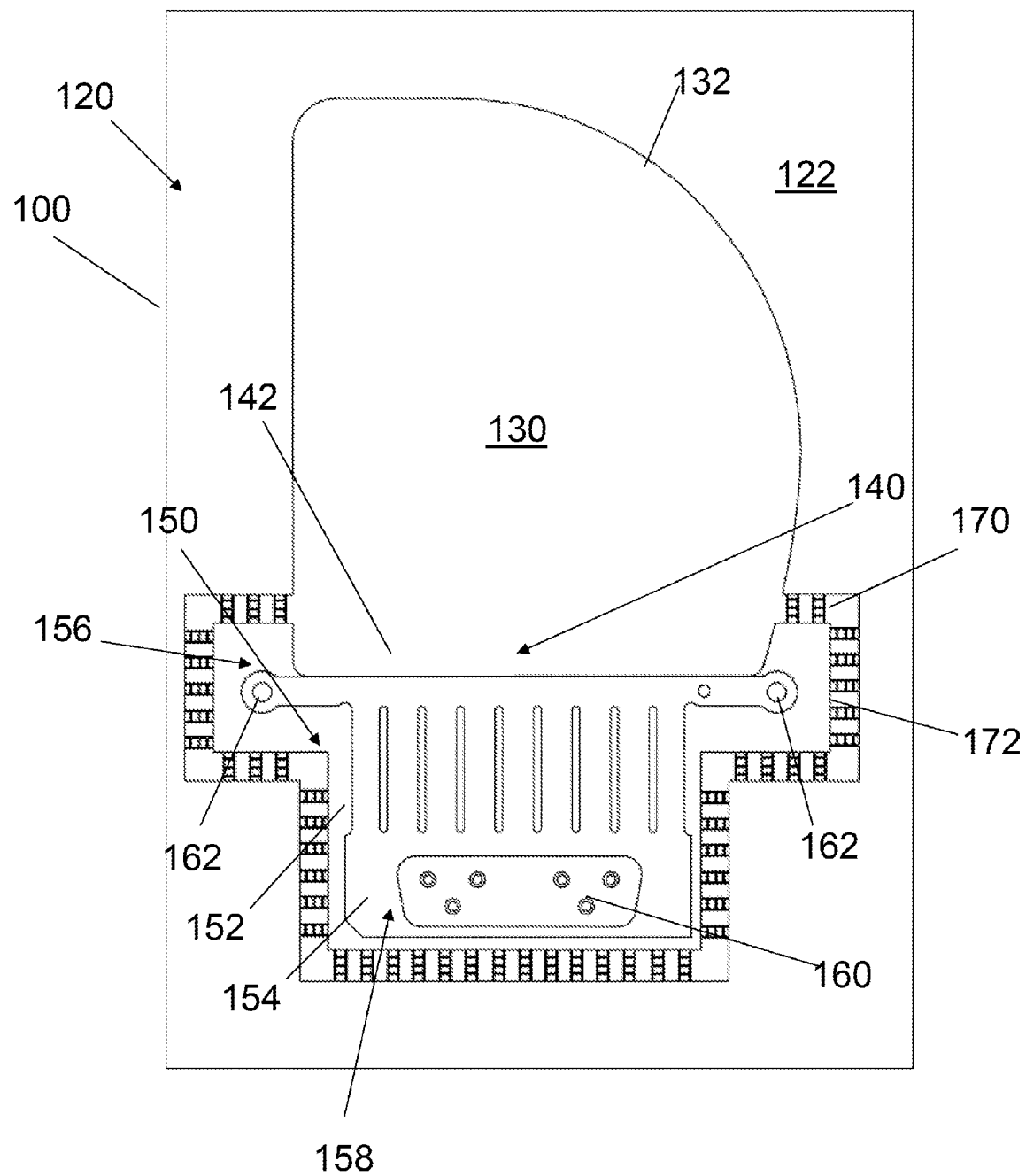
FIG. 6 shows a detail view of a further exemplary embodiment of the first planar segment having a flexible connecting element, which is elastically connected using bridge-type webs to a face of the first planar segment.
Figure 7:
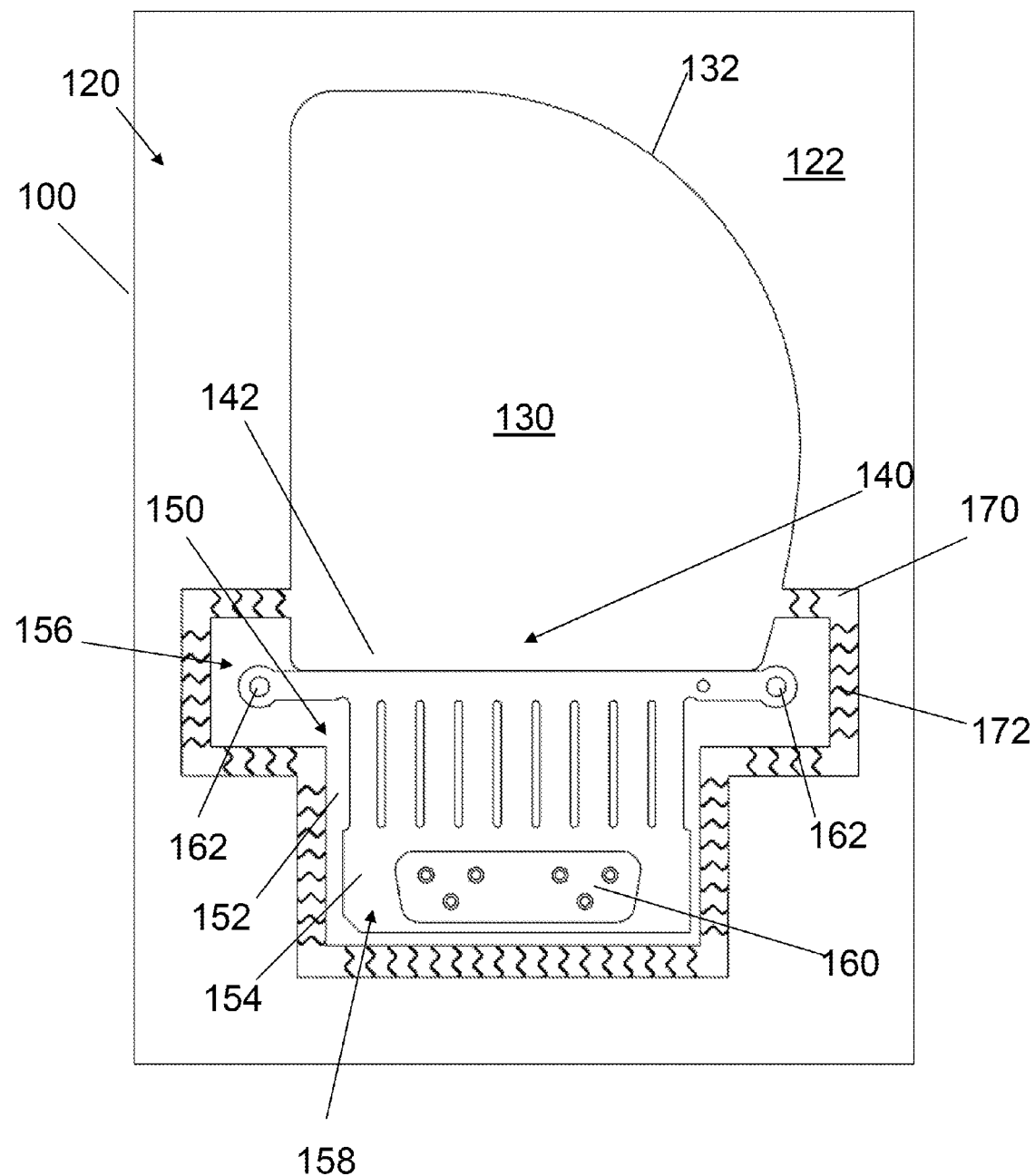
FIG. 7 shows a detail view of a further exemplary embodiment of a first planar segment having a flexible connecting element, which is elastically connected using zigzag webs to a face of the first planar segment.

In FIG. 4, the connecting webs 172 are implemented as serpentine fingers arranged in parallel. In FIG. 5, the connecting webs 172 are implemented as wavy fingers arranged in parallel. In FIG. 6, the connecting webs 172 are implemented as H-shaped elements arranged in parallel. In FIG. 7, the connecting webs 172 are implemented as zigzag fingers arranged in parallel. Of course, the connecting webs 172 can also have other shapes. These structures may be produced easily during the production of the flexible circuit board arrangement 110 by typical structuring methods.

It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof.

Additionally, the disclosure of a range of values is a disclosure of every numerical value within that range.

LIST OF REFERENCE NUMERALS 100 flexible PCB
102 frame 104 marking
106 marking
110 circuit board arrangement
114 unit
120 planar segment
122 face
130 opening
132 edge
140 region
142 interface
150 flexible connecting segment
152 face
156 transverse element
154 web
160 planar region
162 marking
170 trench
172 elastic web
200 rigid PCB
204 marking
210 circuit board arrangement
220 planar segment
250 component
262 marking
300 circuit board composite

We claim:

1. A flexible-rigid circuit board composite, comprising:
   at least one flexible circuit board, each flexible circuit board having at least one first planar segment, wherein at least one flexible connecting element is elastically connected to the at least one first planar segment;
   at least one rigid circuit board, each rigid circuit board having at least one second planar segment, wherein one or more components is disposed on the at least one rigid circuit board; and,
   at least one opening provided within the at least one first planar segment, wherein the at least one opening is configured to permit protrusion of the one or more components through the at least one first planar segment;
   wherein an installed state is formed when the at least one first planar segment is placed on top of the at least one second planar segment and the first and second planar segments electrically and mechanically interact with each other, wherein the at least one flexible connecting element has a crossbeam with a recess that forms a contact zone on which a connection between the at least one flexible connecting element and the at least one second planar segment is formed; and
   wherein the at least one flexible connecting element is configured to enable movement for alignment between the first and second planar segments.

2. The flexible-rigid circuit board composite according to claim 1, wherein the at least one flexible connecting element is embedded within a face of the at least one first planar segment.

3. The flexible-rigid circuit board composite according to claim 1, wherein the at least one flexible connecting element is connected by elastic webs disposed on a face of the at least one first planar segment.

4. The flexible-rigid circuit board composite according to claim 1, wherein the flexible connecting element has a T-shaped footprint.

5. The flexible-rigid circuit board composite according to claim 1, wherein the at least one flexible connecting element directly adjoins the at least one opening.

6. The flexible-rigid circuit board composite according to claim 1, wherein the at least one flexible circuit board is attached to a frame.

7. The flexible-rigid circuit board composite according to claim 6, wherein the at least one flexible circuit board is provided with a plurality of first planar segments configured in a matrix-type arrangement, wherein a face of each first planar segment is provided with the at least one flexible connecting element elastically connected thereto.

8. The flexible-rigid circuit board composite according to claim 7, wherein the at least one rigid circuit board is provided with a plurality of second planar segments configured in the matrix-type arrangement, each second planar segment having at least one surface-mounted component.

9. The flexible-rigid circuit board composite according to claim 8, wherein each first planar segment is provided with at least one opening, wherein the at least one opening is configured to grant access to the at least one surface-mounted component when in the installed state.

10. The flexible-rigid circuit board composite according to claim 3, wherein the elastic webs are disposed within a trench.

11. The flexible-rigid circuit board composite according to claim 8, wherein an individual flexible-rigid circuit board composite is formed via isolation from the installed state of the plurality of first segments and the plurality of second segments.

* * * * *